United States Patent

Joo et al.

[11] Patent Number: 6,151,255
[45] Date of Patent: Nov. 21, 2000

[54] FLASH MEMORY WITH NEGATIVE VOLTAGE GENERATOR FOR DATA ERASURE

[75] Inventors: Young-Dong Joo, Gyunggi-do; Tae-Hum Yang, Seoul, both of Rep. of Korea

[73] Assignee: Hyundai Electronics Industries Co., Ltd., Gyunggi-do, Rep. of Korea

[21] Appl. No.: 09/342,619

[22] Filed: Jun. 29, 1999

[30] Foreign Application Priority Data

Jun. 30, 1998 [KR] Rep. of Korea ....................... 98-26210

[51] Int. Cl.$^7$ .................................................. G11C 16/04
[52] U.S. Cl. ................................ 365/185.29; 365/189.07; 365/189.09
[58] Field of Search .......................... 365/189.07, 189.09, 365/185.26, 185.33, 189.11, 185.29

[56] References Cited

U.S. PATENT DOCUMENTS

| | | | |
|---|---|---|---|
| 5,168,174 | 12/1992 | Naso et al. .............................. | 307/296 |
| 5,442,586 | 8/1995 | Javanifard et al. ...................... | 365/185 |
| 5,553,295 | 9/1996 | Pantelakis et al. ..................... | 395/750 |
| 5,721,707 | 2/1998 | Villa et al. ............................... | 365/218 |
| 5,801,987 | 9/1998 | Dinh ...................................... | 365/185.18 |
| 5,920,505 | 7/1999 | Sali et al. .............................. | 365/185.18 |

*Primary Examiner*—David Nelms
*Assistant Examiner*—Thong Le
*Attorney, Agent, or Firm*—Crompton, Seager & Tufte, LLC

[57] ABSTRACT

A flash memory which is electrically erasable programmable and has a negative voltage generator for data erasure. The negative voltage generator comprises a charge pump for pumping a negative charge, a regulator for regulating the level of an output voltage from the charge pump according to the level of a supply voltage, and a negative voltage supply for supplying a voltage of the level regulated by the regulator to a gate of a memory cell transistor. This construction of the negative voltage generator enables a data erase operation of the flash memory to be performed under the condition that an output voltage from the negative voltage supply is applied to the gate of the cell transistor, the supply voltage is applied to a source of the cell transistor and a drain of the cell transistor floats. Further, a sufficient amount of erase current is secured by the voltages applied to the source and gate of the cell transistor for the data erase operation. Moreover, the negative voltage generator compensates for a variation in the supply voltage suffered by the source side. Therefore, the flash memory of the present invention is capable of performing a stable data erase operation.

2 Claims, 2 Drawing Sheets

FLASH MEMORY WITH NEGATIVE VOLTAGE GENERATOR FOR DATA ERASURE

BACKGROUND OF THE INVENTION

1. Field of the Invention

The present invention relates in general to electrically erasable programmable flash memories, and more particularly to a flash memory with a negative voltage generator for data erasure, which is capable of performing a data erase operation by regulating a gate voltage of a memory cell transistor according to the level of a supply voltage instead of controlling a source voltage of the cell transistor while consuming a large amount of current, so as to significantly improve its erase characteristic.

2. Description of the Prior Art

Generally, because nonvolatile memories have the advantage that data stored therein is subjected to no loss even though power is interrupted, they are widely used for the storage of data in a PC Bios, Set-top Box, printer, network server, etc. Recently, the nonvolatile memories have often been used even in fields such as a digital camera and cellular phone.

Among the nonvolatile memories, flash memories of an electrically erasable programmable read only memory (EEPROM) type have a function of erasing data in all memory cells in the lump. Such flash memories are classified into a NOR-type flash memory wherein at least two memory cell transistors are connected in parallel to one bit line and a NAND-type flash memory wherein at least two memory cell transistors are connected in series to one bit line.

FIG. 1 is a view illustrating the operation of a conventional flash memory with a negative voltage generator for data erasure. The flash memory is of the EEPROM type and the negative voltage generator is used for the erasure of data in memory cells in the flash memory and here denoted by the reference numeral 20. As shown in FIG. 1, the negative voltage generator 20 comprises a charge pump 22 for pumping a negative charge to supply a negative voltage to a control gate 14 of a memory cell transistor for the erasure of data in the associated cell, and a regulator 24 for regulating the level of an output voltage VEEI from the charge pump 22 according to the level of a supply voltage VCC.

In addition to the negative voltage generator 20, the flash memory further comprises a negative voltage supply 30 for supplying the voltage VEEI of the level regulated by the regulator 24 to the control gate 14 of the memory cell transistor for the erasure of data in the associated cell, and a Vs voltage generator 40 for regulating the level of the supply voltage VCC and applying the resultant voltage to a source 18 of the cell transistor.

The operation of the conventional flash memory with the above-mentioned construction will hereinafter be described briefly.

For a data erase operation, the negative voltage supply 30 supplies the output voltage from the negative voltage generator 20 to the control gate 14 of the cell transistor, and the Vs voltage generator 40 supplies its output voltage to the source 18 of the cell transistor. At this time, a drain 16 of the cell transistor floats (F). Also, electrons charged on a floating gate 12 of the cell transistor are emitted to the source 18 due to a Fowler-Nordheim tunneling effect based on a strong electric field formed between the floating gate 12 and the source 18.

However, in the above-mentioned conventional flash memory, because the voltage supplied to the source for the data erasure is generally obtained by a regulator, it is difficult to control the data erase operation based on the current supply capability, resulting in a degradation in the erase characteristic of the memory.

SUMMARY OF THE INVENTION

Therefore, the present invention has been made in view of the above problem, and it is an object of the present invention to provide a flash memory with a negative voltage generator for data erasure, which is capable of changing a data erase condition in such a way that a supply voltage is applied to a source of a memory cell transistor directly without being regulated, an output voltage from the negative voltage generator is supplied to a gate of the cell transistor while being regulated with a variation in the supply voltage and a drain of the cell transistor floats, so as to perform a stable data erase operation.

In accordance with the present invention, the above and other objects can be accomplished by a provision of a flash memory which is electrically erasable programmable and has a negative voltage generator for data erasure, wherein the negative voltage generator comprises a charge pump for pumping a negative charge; a regulator for regulating the level of an output voltage from the charge pump according to the level of a supply voltage; and a negative voltage supply for supplying a voltage of the level regulated by the regulator to a gate of a memory cell transistor; whereby, for a data erase operation of the flash memory, an output voltage from the negative voltage supply is applied to the gate of the cell transistor, the supply voltage is applied to a source of the cell transistor and a drain of the cell transistor floats.

Preferably, the regulator may include a reference voltage generator for generating a reference voltage according to the level of the supply voltage; a comparison voltage generator for generating a voltage to be compared with the reference voltage from the reference voltage generator, according to the level of the output voltage from the charge pump; and a comparator for comparing the reference voltage from the reference voltage generator and the comparison voltage from the comparison voltage generator with each other and feeding the compared result back to the charge pump.

In a feature of the present invention, for a data erase operation of a flash memory, a supply voltage is applied to a source of a memory cell transistor, an output voltage from the negative voltage generator is supplied to a gate of the cell transistor while being regulated with a variation in the supply voltage and a drain of the cell transistor floats. Therefore, a sufficient amount of erase current is secured by the voltages applied to the source and gate of the cell transistor for the data erase operation. Further, the negative voltage generator regulates its output voltage to a desired level with a variation in the supply voltage. Therefore, the negative voltage generator compensates for a variation in the supply voltage suffered by the source side.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
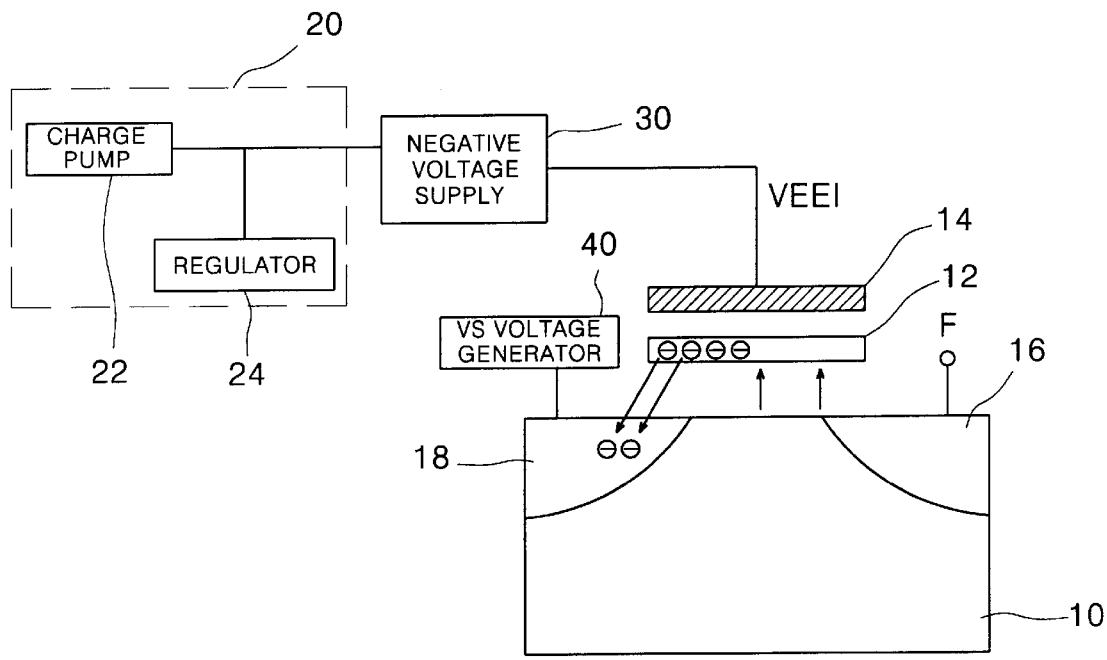
FIG. 1 is a view illustrating the operation of a conventional flash memory with a negative voltage generator for data erasure.
Figure 2:
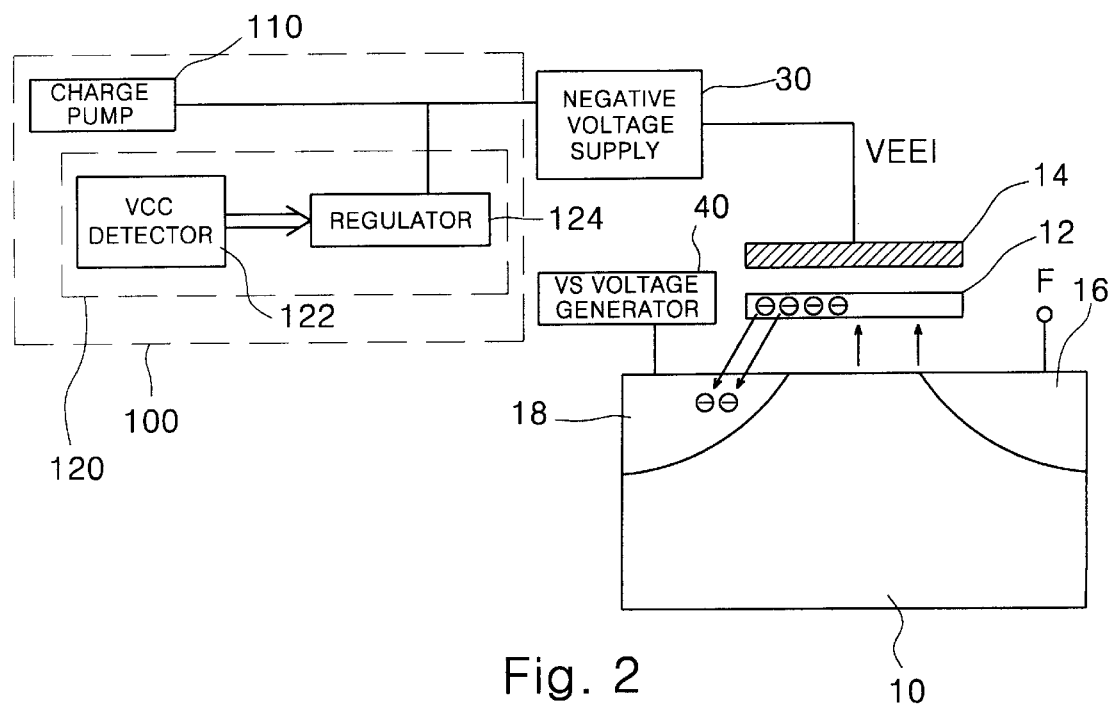
FIG. 2 is a view illustrating the operation of a flash memory with a negative voltage generator for data erasure in accordance with the present invention.

FIG. 2 is a view illustrating the operation of a flash memory with a negative voltage generator for data erasure in accordance with the present invention, wherein the flash memory is of an EEPROM type and the negative voltage generator is used for the erasure of data in memory cells in the flash memory and here denoted by the reference numeral 100.

With reference to FIG. 2, the negative voltage generator 100 comprises a charge pump 110 for pumping a negative charge, and a VCC detector 122 for detecting the level of a supply voltage VCC. A regulator 124 is adapted to regulate the level of an output voltage from the charge pump 110 according to the level of the supply voltage VCC detected by the VCC detector 122. A negative voltage supply 30 is adapted to supply a voltage VEEI of the level regulated by the regulator 124 to a control gate 14 of a memory cell transistor.

The operation of the flash memory with the above-mentioned construction in accordance with the present invention will hereinafter be described in detail.

The flash memory performs a data erase operation in such a way that it emits negative charges stored on a floating gate 12 of the cell transistor to a source 18 of the cell transistor. In the data erase operation, the negative voltage supply 30 supplies the voltage VEEI to the control gate 14 of the cell transistor, and a Vs voltage generator 40 applies the supply voltage VCC as a source voltage Vs to the source 18 of the cell transistor. Also, a drain 16 of the memory cell transistor floats (F).

In other words, in the negative voltage generator 100, the output voltage from the charge pump 110 is regulated to a desired level according to the level of the supply voltage VCC and then applied as an erase voltage to the control gate 14 of the memory cell transistor. As a result, the voltages to the control gate 14 and source 18 of the memory cell transistor are maintained at such proper levels that the negative charges stored on the floating gate 12 can be emitted to the source 18 according to a difference therebetween.

Figure 3:
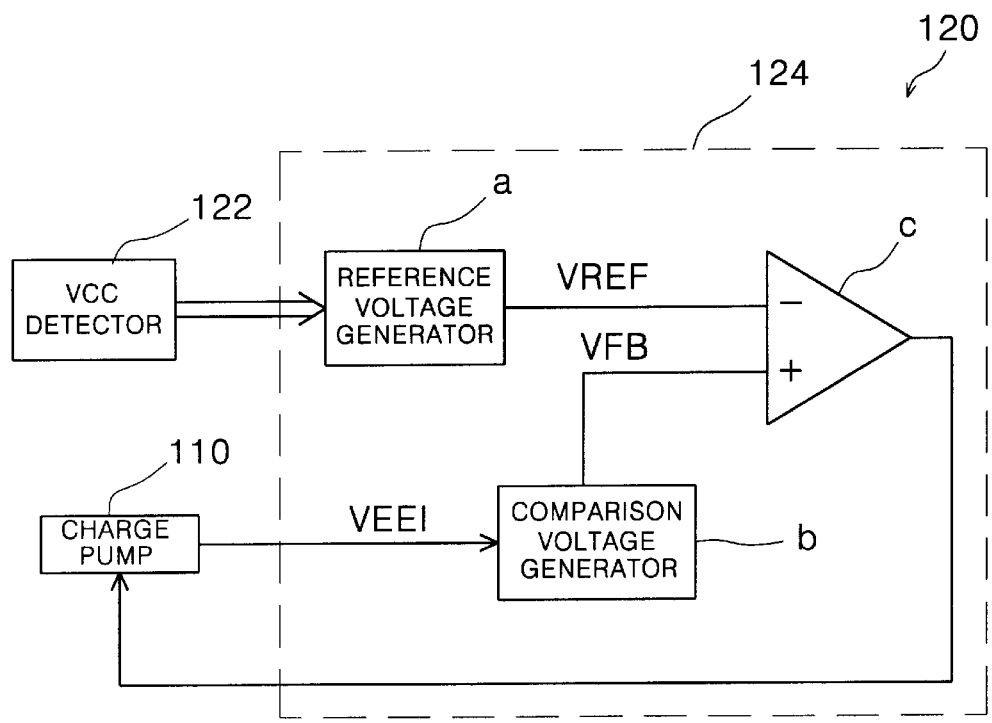
FIG. 3 is a detailed block diagram of an embodiment of a regulator in FIG. 2.

FIG. 3 is a detailed block diagram of an embodiment of the regulator 124 in FIG. 2. As shown in this drawing, the regulator 124 includes a reference voltage generator a for generating a reference voltage VREF according to the level of the supply voltage VCC detected by the VCC detector 122. A comparison voltage generator b is adapted to generate a voltage VFB to be compared with the reference voltage VREF from the reference voltage generator a, according to the level of the output voltage VEEI from the charge pump 110. A comparator c is adapted to input the reference voltage VREF from the reference voltage generator a at its inverting input terminal (−) and the comparison voltage VFB from the comparison voltage generator b at its non-inverting input terminal (+) and compare the levels of the inputted two voltages VREF and VFB with each other. Here, the comparator c feeds its output back to the charge pump 110.

The operation of the regulator 124 with the above-mentioned construction in accordance with the first embodiment of the present invention will hereinafter be described in detail.

The regulator 124 functions to generate the erase voltage to drive the gate of the cell transistor for the data erase operation. Namely, in the regulator 124, the reference voltage generator a generates the reference voltage VREF according to the level of the supply voltage VCC detected by the VCC detector 122. The reference voltage VREF is used for the regulation to maintain the erase voltage to the gate of the cell transistor at a desired level. The comparison voltage generator b generates the voltage VFB to be compared with the reference voltage VREF from the reference voltage generator a, according to the level of the output voltage VEEI from the charge pump 110. The comparator c inputs the reference voltage VREF from the reference voltage generator a and the comparison voltage VFB from the comparison voltage generator b and compares the levels of the inputted two voltages VREF and VFB with each other. Then, the comparator c feeds its output back to the charge pump 110. As a result, the output voltage VEEI from the charge pump 110 is regulated to a desired level on the basis of a control value from the regulator 124 fed back thereto.

Figure 4:
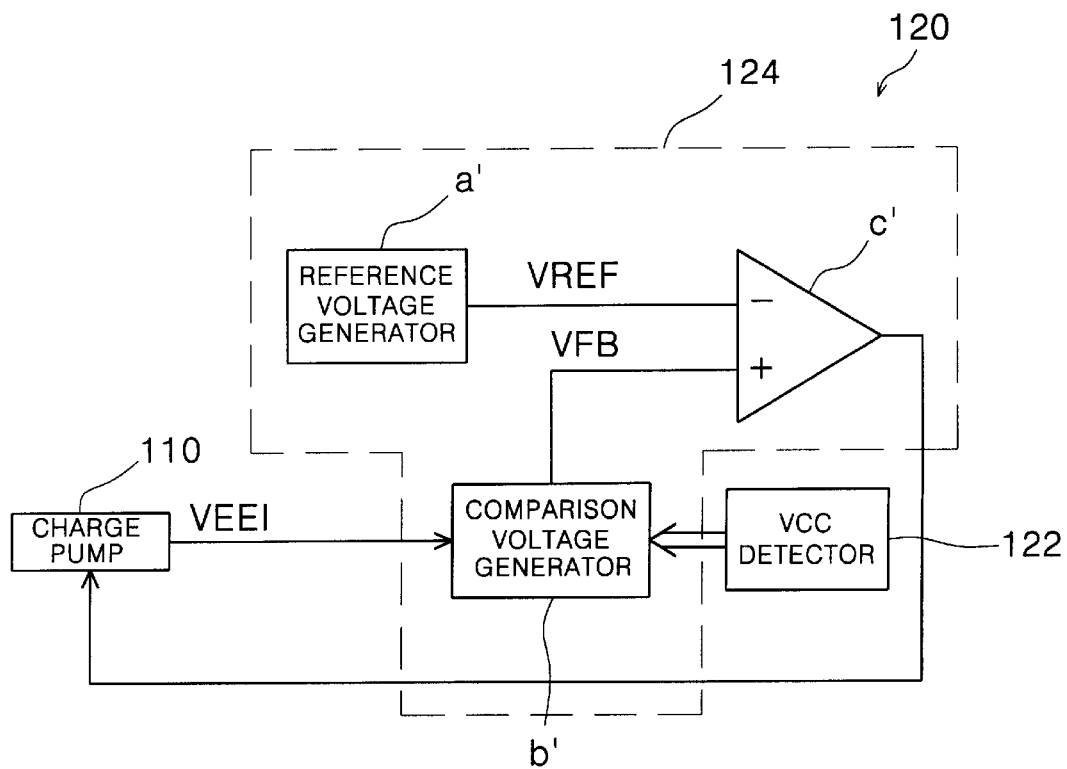
FIG. 4 is a detailed block diagram of an alternative embodiment of the regulator in FIG. 2.

FIG. 4 is a detailed block diagram of an alternative embodiment of the regulator 124 in FIG. 2. As shown in this drawing, the regulator 124 includes a reference voltage generator a' for generating a reference voltage VREF. A comparison voltage generator b' is adapted to regulate the level of the output voltage VEEI from the charge pump 110 with a variation in the supply voltage VCC according to the level of the supply voltage VCC detected by the VCC detector 122 and output the resultant voltage as a voltage VFB to be compared with the reference voltage VREF from the reference voltage generator a'. A comparator c' is adapted to input the reference voltage VREF from the reference voltage generator a' at its inverting input terminal (−) and the comparison voltage VFB from the comparison voltage generator b' at its non-inverting input terminal (+) and compare the levels of the inputted two voltages VREF and VFB with each other. Here, the comparator c' feeds its output back to the charge pump 110.

The operation of the regulator 124 with the above-mentioned construction in accordance with the second embodiment of the present invention will hereinafter be described in detail.

In a similar manner to the construction of FIG. 3, the regulator 124 in FIG. 4 functions to generate the erase voltage to drive the gate of the cell transistor for the data erase operation. Namely, in the regulator 124, the reference voltage generator a' generates the reference voltage VREF. The comparison voltage generator b' regulates the level of the output voltage VEEI from the charge pump 110 with a variation in the supply voltage VCC according to the level of the supply voltage VCC detected by the VCC detector 122 and outputs the resultant voltage as the voltage VFB to be compared with the reference voltage VREF from the reference voltage generator a'. The comparator c' inputs the reference voltage VREF from the reference voltage generator a' and the comparison voltage VFB from the comparison voltage generator b' and compares the levels of the inputted two voltages VREF and VFB with each other. Then, the comparator c' feeds the compared result back to the charge pump 110. As a result, the output voltage VEEI from the charge pump 110 is regulated to a desired level on the basis of a control value from the regulator 124 fed back thereto.

As apparent from the above description, according to the present invention, a sufficient amount of erase current can be secured by the voltages applied to the source and gate of the cell transistor for the data erase operation. Further, the negative voltage generator compensates for a variation in the supply voltage suffered by the source side. Therefore, the flash memory of the present invention has the effect of performing a stable data erase operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flash memory which is electrically erasable programmable and has a negative voltage generator for data erasure, wherein said negative voltage generator comprises:
   a charge pump for pumping a negative charge;
   a regulator for regulating the level of an output voltage from said charge pump according to the level of a supply voltage including,
      a reference voltage generator for generating a reference voltage according to the level of said supply voltage;
      a comparison voltage generator for generating a voltage to be compared with said reference voltage from said reference voltage generator, according to the level of the output voltage from said charge pump; and
      a comparator for comparing said reference voltage from said reference voltage generator and said comparison voltage from said comparison voltage generator with each other and feeding the compared result back to said charge pump; and
   a negative voltage supply for supplying a voltage of the level regulated by said regulator to a gate of a memory cell transistor;
   whereby, for a data erase operation of said flash memory, an output voltage from said negative voltage supply is applied to said gate of said cell transistor, said supply voltage is applied to a source of said cell transistor while the drain of said memory cell transistor floats.

2. A flash memory which is electrically erasable programmable and has a negative voltage generator for data erasure, wherein said negative voltage generator comprises:
   a charge pump for pumping a negative charge;
   a regulator for regulating the level of an output voltage from said charge pump according to the level of a supply voltage including,
      a reference voltage generator for generating a reference voltage;
      a comparison voltage generator for regulating the level of the output voltage from said charge pump according to the level of said supply voltage and outputting the resultant voltage for the comparison with said reference voltage from said reference voltage generator; and
      a comparator for comparing said reference voltage from said reference voltage generator and said comparison voltage from said comparison voltage generator with each other and feeding the compared result back to said charge pump; and
   a negative voltage supply for supplying a voltage of the level regulated by said regulator to a gate of a memory cell transistor;
   whereby, for a data erase operation of said flash memory, an output voltage from said negative voltage supply is applied to said gate of said cell transistor, said supply voltage is applied to a source of said cell transistor while the drain of said memory cell transistor floats.

* * * * *